United States Patent
Hatanaka et al.

(10) Patent No.: US 8,084,368 B2
(45) Date of Patent: Dec. 27, 2011

(54) METHOD OF FORMING BARRIER FILM

(75) Inventors: Masanobu Hatanaka, Shizuoka (JP);
Michio Ishikawa, Shizuoka (JP);
Kanako Tsumagari, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 233 days.

(21) Appl. No.: 12/447,533

(22) PCT Filed: Nov. 8, 2007

(86) PCT No.: PCT/JP2007/071720
§ 371 (c)(1),
(2), (4) Date: Dec. 1, 2009

(87) PCT Pub. No.: WO2008/056742
PCT Pub. Date: May 15, 2008

(65) Prior Publication Data
US 2010/0068891 A1 Mar. 18, 2010

(30) Foreign Application Priority Data

Nov. 9, 2006 (JP) .................................. 2006-304485
Feb. 27, 2007 (JP) .................................. 2007-047943

(51) Int. Cl.
*H01L 21/46* (2006.01)
(52) U.S. Cl. .. 438/758; 438/761; 438/762; 257/E21.482
(58) Field of Classification Search .................. 438/758, 438/760, 761, 762; 257/E21.482
See application file for complete search history.

(56) References Cited

U.S. PATENT DOCUMENTS 7,276,725 B2 * 10/2007 Eun .................................. 257/35
2003/0111963 A1  6/2003 Tolmachev et al.
2005/0268852 A1 12/2005 Hatanaka et al.

FOREIGN PATENT DOCUMENTS

| JP | 10-255998   | 9/1998  |
| JP | 2003-249493 | 9/2003  |
| JP | 2004-006856 | 1/2004  |
| JP | 2004-296490 | 10/2004 |
| JP | 2005-082849 | 3/2005  |
| JP | 2006-009144 | 1/2006  |
| JP | 2006-057162 | 3/2006  |

OTHER PUBLICATIONS

Sung, J., et al., "Remote-plasma chemical vapor deposition of conformal ZrB2 films at low termperature: A promising diffusion barrier for ultralarge scale integrated electronics," J. Appl. Phys., vol. 91, No. 6, Mar. 15, 2002, pp. 3904-3907.
International Search Report for PCT Patent App. No. PCT/JP2007/071720 (Jan. 22, 2008).

* cited by examiner

*Primary Examiner* — Thinh T Nguyen
(74) *Attorney, Agent, or Firm* — Cermak Nakajima LLP; Tomoko Nakajima

(57) ABSTRACT

A barrier film made of a $ZrB_2$ film is formed by use of a coating apparatus provided with plasma generation means including a coaxial resonant cavity and a microwave supply circuit for exciting the coaxial resonant cavity, the coaxial resonant cavity including spaced apart conductors provided around the periphery of a nonmetallic pipe for reactive gas introduction, the coaxial resonant cavity having an inner height equal to an integer multiple of one-half of the exciting wavelength, the plasma generation means being constructed such that a gas injected from one end of the nonmetallic pipe is excited into a plasma state by a microwave when the gas is in a region of the nonmetallic pipe which is not covered with the conductors and such that the gas in the plasma state is discharged from the other end of the nonmetallic pipe.

16 Claims, 13 Drawing Sheets

To Material Gas Tube

Fig.13A
Fig.13C
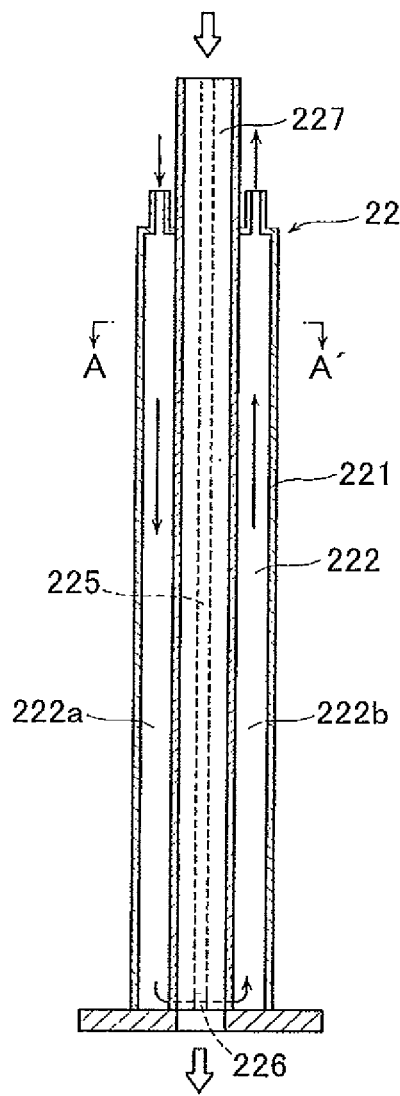
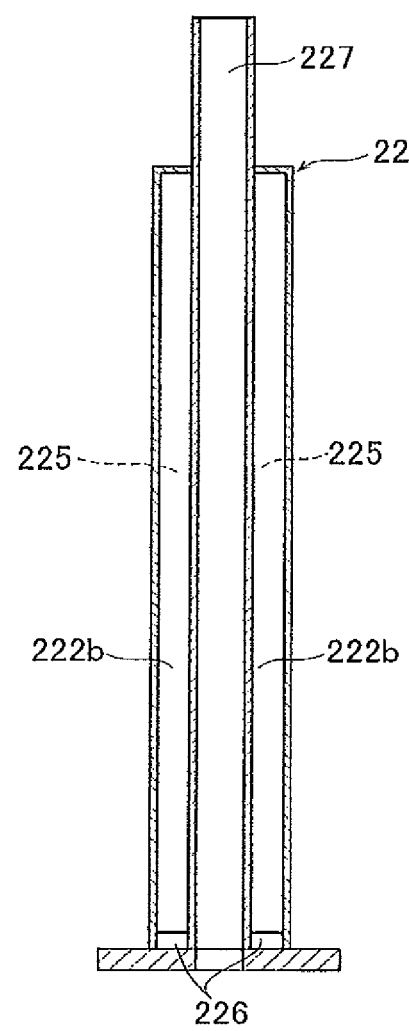
Fig.13B
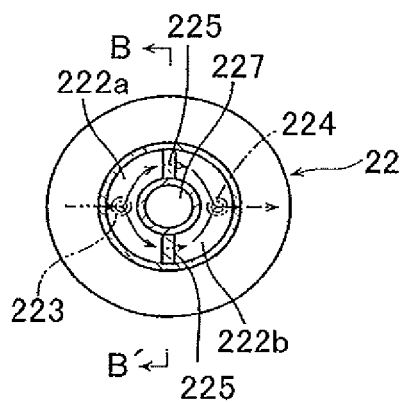

METHOD OF FORMING BARRIER FILM

This application is a national phase entry under 35 U.S.C. §371 of PCT Patent Application No. PCT/JP2007/071720, filed on Nov. 8, 2007, which claims priority under 35 U.S.C. §119 to Japanese Patent Application Nos. 2006-304485, filed Nov. 9, 2006, and 2007-047943, filed Feb. 27, 2007, all of which are incorporated by reference.

TECHNICAL FIELD

The present invention relates to a method of forming a barrier film.

BACKGROUND ART

With the scaling down of patterns of semiconductor integrated circuits, there have recently been proposed so-called "buried wiring structures," in which fine contact holes, trenches, etc. having a high aspect radio are buried with a wiring material such as Cu or Al.

However, these buried wiring structures are disadvantageous in that when the main wiring material is, e.g., Cu, it tends to diffuse into the insulating film, thereby causing problems. Therefore, a conductive barrier film is provided between the insulating film and the wiring material to limit or prevent diffusion of Cu. Various methods of forming this barrier film have been proposed. For example, one known method is to deposit a material layer of Ta, TiN, TaN, etc. using PVD, MOCVD, or ALD to form a barrier film (see, e.g., Patent Document 1).

ALD is a technique of forming a desired metal film by first causing a precursor of one type to be adsorbed on the substrate surface (adsorption process), then supplying another precursor to the adsorbed precursor so that they contact and react with each other on the substrate surface (modification process), and then repeating these processes. Generally, ALD has an advantage over CVD in that it can be performed at lower temperature and allows for formation of a film having better coverage.

Incidentally, in addition to Ta and TiN films, $ZrB_2$ films are known to have good barrier properties. As is known in the art, a $ZrB_2$ film can be formed from $Zr(BH_4)_4$ material according to the reaction formula (I) below.

$$Zr(BH_4)_4 \rightarrow ZrB_2 + B_2H_6 + 5H_2 \qquad (1)$$

The reaction (1) above is practically effected by thermally decomposing the raw material by the direct heat from the Si substrate, thereby forming a $ZrB_2$ film on the substrate. However, in order to form a good $ZrB_2$ film, this method requires that the substrate be heated to 550° C. or more, which is not desirable.

One way to avoid this problem is a known CVD technique which forms a $ZrB_2$ film on the Si substrate by adding hydrogen radicals to the material and then causing the material to react at low temperature (namely, 300-350° C.) by the heat from the hydrogen radicals and the substrate (see, e.g., Nonpatent Document 1).

Such addition of hydrogen radicals requires excitation of hydrogen gas. One known apparatus for exciting such gas is a microwave-excited plasma processing apparatus that uses a waveguide for introducing a microwave (see, e.g., Patent Document 2).

Patent Document 1: Japanese Laid-Open Patent Publication No. 2004-6856 (Claim 3, FIG. 4, etc.)
Patent Document 2: Japanese Laid-Open Patent Publication No. 10-255998 (Claim 1, FIG. 1, etc.)
Nonpatent Document 1: J. Appl. Phys., Vol. 91, No. 6, 15 Mar. 2002, pp. 3904-3907 (p. 3904)

DISCLOSURE OF THE INVENTION

Problems to be Solved by the Invention

However, the above method of forming a $ZrB_2$ film serving as a barrier film by directly thermally decomposing a material according to the above reaction formula (1) is disadvantageous in that the deposition temperature is high and hence Cu and Al cannot be used as the wiring material of the semiconductor device.

Further, the microwave-excited plasma processing apparatus as described above is disadvantageous in that since the microwave propagates through the waveguide, there is a considerable time lag between the generation of the microwave and the generation of plasma, meaning that this apparatus is not suitable for ALD, which repeats adsorption and modification processes many times.

The present invention has been made to solve the above problems with the prior art. It is, therefore, an object of the present invention to provide a method of efficiently forming a $ZrB_2$ barrier film via a low temperature ALD process using a microwave-excited plasma processing apparatus capable of quick generation of plasma in such a manner that the barrier film fully and closely covers the inner surfaces of fine holes, trenches, etc. without any overhang above these features.

Means for Solving the Problems

A method of the present invention for forming a barrier film uses a coating apparatus provided with plasma generation means including a coaxial resonant cavity and a microwave supply circuit, the coaxial resonant cavity including spaced apart conductors provided on an upper portion and a lower portion of the periphery of a nonmetallic pipe for reactive gas introduction, the coaxial resonant cavity having an inner height equal to an integer multiple of one-half of the exciting wavelength, the plasma generation means being constructed such that a gas injected from one end of the nonmetallic pipe is excited into a plasma state by a microwave when the gas is in a region of the nonmetallic pipe which is not provided with the conductors and such that the gas in the plasma state is discharged from the other end of the nonmetallic pipe, the method comprising: placing an object to be coated within a vacuum chamber of the coating apparatus, the object to be coated having an insulating film with a hole and a trench formed therein; and reacting a material gas composed of $Zr(BH_4)_4$ gas with a plasma gas over a surface of the object to be coated, using ALD, to form a barrier film made of a $ZrB_2$ film on the insulating film and on an inner surface of the hole and an inner surface of the trench, the plasma gas being obtained by converting a reactive gas composed of $H_2$ gas into a plasma state by the plasma generation means. Deposition using such an apparatus enables a $ZrB_2$ barrier film to be efficiently formed in a low temperature process in such a manner that the barrier film fully covers the inner surfaces of fine holes and trenches.

The method of the present invention for forming a barrier film preferably further comprises: repeating an adsorption step and a modification step to form the barrier film made of the $ZrB_2$ film on the insulating film and on the inner surface of the hole and the inner surface of the trench, wherein the adsorption step supplies the material gas and the reactive gas such that the material gas is adsorbed on the object to be coated having the insulating film with the hole and the trench formed therein; and wherein the modification step shuts off the supply of the material gas, continuously supplies only the reactive gas, and converts the supplied reactive gas into a plasma state by the plasma generation means such that the reactive gas in the plasma state reacts with and modifies the material gas adsorbed on the object to be coated.

Alternatively, the method of the present invention for forming a barrier film preferably further comprises: repeating an adsorption step and a modification step to form the barrier film made of the $ZrB_2$ film on the insulating film and on the inner surface of the hole and the inner surface of the trench, wherein the adsorption step supplies the material gas and the reactive gas which has been converted into a plasma state by the plasma generation means, such that the material gas is adsorbed on the object to be coated having the insulating film with the hole and the trench formed therein; and wherein the modification step shuts off only the supply of the material gas and continuously supplies the reactive gas which has been converted into the plasma state by the plasma generation means, such that the reactive gas in the plasma state reacts with and modifies the material gas adsorbed on the object to be coated.

An alternative method of the present invention for forming a barrier film uses a coating apparatus provided with plasma generation means including a coaxial resonant cavity and a microwave supply circuit, the coaxial resonant cavity including spaced apart conductors provided on an upper portion and a lower portion of the periphery of a nonmetallic pipe for reactive gas introduction, the coaxial resonant cavity having an inner height equal to an integer multiple of one-half of the exciting wavelength, the plasma generation means being constructed such that a gas injected from one end of the nonmetallic pipe is excited into a plasma state by a microwave when the gas is in a region of the nonmetallic pipe which is not provided with the conductors and such that the gas in the plasma state is discharged from the other end of the nonmetallic pipe, the method comprising: placing an object to be coated within a vacuum chamber of the coating apparatus, the object to be coated having an insulating film with a hole and a trench formed therein; and reacting a material gas composed of $Zr(BH_4)_4$ gas with a plasma gas over a surface of the object to be coated, using ALD, to form a barrier film made of a ZrBN film on the insulating film and on an inner surface of the hole and an inner surface of the trench, the plasma gas being obtained by converting a reactive gas composed of $H_2$ gas mixed with at least one of $N_2$ and $NH_3$ into a plasma state by the plasma generation means. The mixing of the $H_2$ gas, i.e., reactive gas, with at least one of $N_2$ and $NH_3$ ensures that the reactive gas will remain in a radical state for a longer period. Further, deposition using such an apparatus and such a reactive gas enables a ZrBN barrier film to be efficiently formed in a low temperature process in such a manner that the barrier film fully covers the inner surfaces of fine holes and trenches.

The alternative method of the present invention preferably further comprises: repeating an adsorption step and a modification step to form the barrier film made of the ZrBN film on the insulating film and on the inner surface of the hole and the inner surface of the trench, wherein the adsorption step supplies the material gas and the reactive gas such that the material is adsorbed on the object to be coated having the insulating film with the hole and the trench formed therein; and wherein the modification step shuts off the supply of the material gas, continuously supplies only the reactive gas, and converts the supplied reactive gas into a plasma state by the plasma generation means such that the reactive gas in the plasma state reacts with and modifies the material gas adsorbed on the object to be coated. Alternatively, the alternative method of the present invention preferably further comprises: repeating an adsorption step and a modification step to form the barrier film made of the ZrBN film on the insulating film and on the inner surface of the hole and the inner surface of the trench, wherein the adsorption step supplies the material gas and the reactive gas which has been converted into a plasma state by the plasma generation means, such that the material gas is adsorbed on the object to be coated having the insulating film with the hole and the trench formed therein; and wherein the modification step shuts off only the supply of the material gas and continuously supplies the reactive gas which has been converted into the plasma state by the plasma generation means, such that the reactive gas in the plasma state reacts with and modifies the material gas adsorbed on the object to be coated.

The flow rate of the reactive gas in the adsorption step preferably differs from the flow rate of the reactive gas in the modification step. The barrier film is preferably formed while the object to be coated is heated to a temperature of 50-300° C.

Further, the barrier film is preferably formed while a cooling gas is introduced into the coaxial resonant cavity to cool the region of the nonmetallic pipe which is not provided with the conductors. Further, the nonmetallic pipe preferably has double sidewalls, and the barrier film is preferably formed while a cooling fluid is circulated through the space between the sidewalls to cool the nonmetallic pipe. These cooling means make it possible to prevent etching of the inner walls of the nonmetallic pipe and to increase the generation efficiency of radicals.

EFFECTS OF THE INVENTION

Thus the present invention performs adsorption and modification steps at low temperature using ALD in a coating apparatus provided with microwave-excited plasma generation means, resulting the advantage that the formed barrier film fully and closely covers high aspect ratio fine holes, trenches, etc. without any overhang above these features.

BEST MODES OF CARRYING OUT THE INVENTION

There will first be described a first coating apparatus used in a method of forming a film according to the present invention. The first coating apparatus includes a vacuum chamber having at its bottom portion a stage for mounting an object to be coated thereon, and also includes a shower head structure provided at the ceiling of the vacuum chamber and facing the object to be coated. This shower head structure will now be described in detail with reference to FIG. 1.

The shower head structure 1 includes a coaxial resonant cavity 11 provided at its top portion, a reactive gas introduction chamber 12 connected to the bottom portion of the coaxial resonant cavity 11, and a shower head unit 13 connected to the reactive gas introduction chamber 12.

The coaxial resonant cavity 11 is made of, e.g., copper or aluminum, and a nonmetallic pipe 111 penetrates through the ceiling and bottom walls of the cavity. The top portion of the nonmetallic pipe 111 is connected through flow rate control means to a reactive gas source, not shown. The nonmetallic pipe 111 may be a quartz, sapphire, or aluminum tube. However, it is preferably a sapphire or aluminum tube to reduce particles.

An upper conductor 112 is movably and concentrically mounted around the upper portion of this nonmetallic pipe 111 and covers the periphery of that portion. The bottom wall of the coaxial resonant cavity 11 below the upper conductor 112 serves as a lower conductor 113. The portion of the nonmetallic pipe 111 between these two conductors is exposed, and this exposed portion, 111a, is irradiated with a microwave. It should be noted that although in FIG. 1 the bottom wall of the coaxial resonant cavity 11 is shown to serve as the lower conductor 113, it is to be understood that another member may be mounted on the bottom portion of the coaxial resonant cavity 11 and used as the lower conductor 113.

To generate plasma in the region inside the exposed portion 111a of the nonmetallic pipe 111, microwave supply means 14 is mounted on the sidewall of the coaxial resonant cavity 111 at a position corresponding to that of the exposed portion 111a. This microwave supply means 14 includes: a magnetron 141 for generating a microwave; a microwave power supply 142 for powering the magnetron 141; an antenna 143 connected to the magnetron 141 to apply the microwave generated by the magnetron 141 at a resonant frequency (e.g., 2.45 GHz) to the coaxial resonant cavity 11; and a coaxial cable 144 connected between the antenna 143 and the magnetron 141. When the microwave power supply 142 is activated, the magnetron 141 generates a microwave, which passes through the coaxial cable 144 to the antenna 143 mounted at the wall surface. When this microwave is transmitted within the coaxial resonant cavity 11 through the antenna 143, the reactive gas that has been introduced into the top portion of the nonmetallic pipe 111 and has reached the region in the exposed portion 111a is converted into a plasma state and this plasma gas is delivered into the reactive gas introduction chamber 12 through the lower portion of the nonmetallic pipe 111, which portion serves as a gas flow path. Thus, this apparatus does not include a waveguide for propagating the microwave. This means that the generation of the microwave quickly results in generation of plasma, making the apparatus suitable for ALD. Although in FIG. 1 only one antenna 143 is shown, it is to be understood that two or more antennas may be used. Further, since, as described above, the upper conductor 112 is movable, its position may be varied to vary the electric field generated between the upper and lower conductors 112 and 113 and thereby vary the conditions under which the plasma is generated.

Generally, the generation of plasma in a plasma generation space results in a change in the electric field distribution and hence in the resonant frequency of the space, consequently lowering the plasma generation efficiency. If the microwave supply means is adjusted to compensate for this change, there results in a time lag between the generation of the microwave and the generation of the plasma, making the apparatus unsuitable for ALD.

To avoid this problem, the first coating apparatus is constructed such that the inner height L of the coaxial resonant cavity 11 is equal to an integer multiple of one-half of the exciting wavelength to ensure that the resonant frequency does not change due to the generation of the plasma. More specifically, the electric field distribution in the coaxial resonant cavity 11 transitions from the TM mode to the TEM mode as a result of the generation of the plasma. Therefore, the resonant frequencies of the coaxial resonant cavity 11 before and after the plasma generation were calculated based on an electrical equivalent circuit for each mode, and the height L was determined so that both resonant frequencies are equal. This arrangement allows limiting the change in the resonant frequency due to the generation of the plasma.

It should be noted that even if the inner height L of the coaxial resonant cavity 11 is determined in this way, the resonant frequency in the cavity may change slightly due to the generation of the plasma. To prevent this, the microwave supply means 14 of the first coating apparatus preferably includes an exciting current control circuit. This control circuit is adapted to monitor the frequency in the coaxial resonant cavity 11 before and after the generation of the plasma and to receive a signal corresponding to the change, if any, in the frequency. The exciting current control circuit supplies an exciting current corresponding to this signal to the exciting coil, not shown, in the magnetron 141 to maintain the wavelength of the microwave constant.

Further, if the change in the frequency in the coaxial resonant cavity 11 results in the generation of a reflected wave in the plasma generation chamber when a microwave is generated therein, then the microwave supply means 14 may include an anode voltage control circuit which detects the reflected wave, generates a voltage corresponding to the difference in phase between the detected reflected wave and the forward wave component of the generated microwave, and adds this voltage to the voltage of the anode electrode in the magnetron to adjust the frequency in the cavity to the desired resonant frequency. In this case, since the reflected wave energy is converted into heat in the microwave supply means, care must be taken so that the anode voltage control circuit is not damaged by this heat. Further, a choke structure having an electrical length equal to one-quarter of the oscillation wavelength may be provided in the lower conductor 113 to limit the leaking of the microwave from the exposed portion 111a.

Thus, the first coating apparatus is constructed such that the inner height L of the coaxial resonant cavity 11 is equal to an integer multiple of one-half of the exciting wavelength in order to maintain the resonant frequency constant. Further, the first coating apparatus includes an exciting current control circuit and an anode voltage control circuit to automatically adjust the resonant frequency to the desired value even if the resonant frequency deviates from that value due to the generation of the plasma. Further, in this apparatus, there is no time lag between the generation of the microwave and the generation of the plasma, allowing the period of plasma generation to be adjusted to a very short time (e.g., 0.5 seconds), making the apparatus very suitable for ALD, in which adsorption and modification processes are repeated many times.

The reactive gas in the nonmetallic pipe 111 of the coaxial resonant cavity 11 which has been excited by the plasma is introduced into the shower head unit 13 through the reactive gas introduction chamber 12. The reactive gas introduction chamber 12 is made of, e.g., aluminum and preferably has a quartz inner lining on its inner walls to prevent generation of particles. In this case, the quartz inner lining preferably covers the entire inner walls of the gas introduction chamber 12, although it may cover only the lower regions of the inner walls (i.e., the regions adjacent the shower head unit 13), as shown in FIG. 1. Further, the surfaces of the inner walls of the reactive gas introduction chamber 12 may be anodized to prevent deactivation of gas radicals.

Further, the reactive gas introduction chamber 12 may be cooled by cooling means, not shown. A ceramic flange 122 (having a thickness of, e.g., 10 mm) is disposed between the reactive gas introduction chamber 12 and the shower head unit 13 and fixed in place by fixing members 123 and 124. This ceramic flange 122 serves to block the transmission of heat from the shower head unit 13 to the reactive gas introduction chamber 12 and thereby prevent the chamber from being heated up. The ceramic flange 122 is preferably made of alumina ceramic so as to have good vacuum sealing properties, high thermal resistance, and good thermal blocking properties.

The shower head unit 13 includes a disc-like member 13a, a ring-like member 13b, a first shower plate 13c, and a second shower plate 13d which are fixed together at selected points by fixing members 123. The disc-like member 13a is preferably provided with a heater and a thermocouple, not shown, so that the shower head unit 13 can be heated to a predetermined temperature (e.g., approximately 150° C.) by the heater and that the temperature of the heated shower head unit 13 can be measured and monitored by use of the thermocouple. Further, the disc-like member 13a has formed therein an opening which communicates with the reactive gas introduction chamber 12. This opening and the opening in the ring-like member 13b form a reactive gas diffusion chamber 131 in which the introduced reactive gas is diffused. The reactive gas diffusion chamber 131 has a quartz inner lining covering its entire inner walls and also has a plurality of reactive gas spray holes 132 formed in its bottom surface. These reactive gas spray holes 132 penetrate through the first and second shower plates 13c and 13d to the bottom surface of the shower head unit 13.

Further, the disc-like member 13a has therein a material gas introduction tube 133 connected to a material gas introduction apparatus. This material gas introduction tube 133 is connected through a gas path 134 to a material gas diffusion chamber 135 formed in the second shower plate 13d. The gas path 134 is made up of a gas path 134a formed in the peripheral portion of the ring-like member 13b and gas paths 134b formed in the peripheral portion of the first shower plate 13c. More specifically, this gas path 134 includes one or more successive stages, or groups, of paths, and each stage includes $2^{n-1}$ gas paths 134a or 134b, where n is the order of the stage. The gas path 134 is configured such that the junctions between the gas paths 134b of the last stage and the material gas diffusion chamber 135 are at equal path distances from the junction between the material gas introduction tube 113 and the gas path 134a of the first stage. This gas path 134 will be described in detail with reference to FIGS. 2 and 3. FIGS. 2(a) to 2(c) are horizontal cross-sectional views of the ring-like member 13b, the first shower plate 13c, and the second shower plate 13d, respectively. FIG. 3 is a schematic diagram illustrating the positional relationship between the material gas introduction tube 133, the gas path 134, and the material gas diffusion chamber 135.

The gas path 134 includes the circular arc gas path 134a disposed in the ring-like member 13b and the two circular arc gas paths 134b disposed around the region of the first shower plate 13c in which the reactive gas spray holes 132 are formed. The material gas introduction tube 133 is connected to the upper center portion of the gas path 134a. Further, connection holes 134c are formed at the bottom portions of the respective ends of the gas path 134a. Each connection hole 134c is connected to the upper center portion of a respective gas path 134b disposed in the first shower plate 13c, so that the gas path 134a communicates with the gas paths 134b.

Further, connection holes 134d are formed at the bottom portions of the respective ends of each gas path 134b. These connection holes 134d are respectively connected to the four upper corners of the material gas diffusion chamber 135 in the second shower plate 13d, ensuring that the material gas is uniformly discharged into the material gas diffusion chamber 135 through the connection holes 134d.

Thus, the gas path 134 connected between the material gas diffusion chamber 135 and the material gas introduction tube 133 includes two stages of paths. The material gas introduction tube 133 is connected to the center portion of the gas path 134a of the first stage, and the connection holes 134c formed at the bottom portions of the respective ends of the gas path 134a of the first stage are connected to the center portions of the respective gas paths 134b of the second stage, so that the gas paths 134b communicate with the gas path 134a. Further, connection holes 134d formed at the bottom portions of the respective ends of each gas path 134b are connected to the material gas diffusion chamber 135, thus forming a gas flow path. This gas path 134 is configured such that the connection holes 134d are at equal path distances from the material gas introduction tube 133, ensuring that equal amounts of material gas pass through the gas paths 134b to reach the material gas diffusion chamber 135 at the same time and uniformly diffuse in the chamber. It should be noted that although in the figures the gas path 134 includes two stages of paths and four connection holes 134d, it is to be understood that the gas path 134 may include three or more stages of paths and more connection holes 134d. For example, on the bottom portion of the first shower plate, there may be provided a third shower plate which has formed therein reactive gas spray holes similar to those in the first shower plate and which also has four gas paths formed therein. With this arrangement, the connection holes in the first shower plate may be respectively connected to the upper center portions of the four gas paths in the third shower plate, and connection holes connected to the material gas diffusion chamber of the second shower plate may be formed at the respective end portions of each gas path in the third shower plate (i.e., a total of eight connection holes are formed in the third shower plate). With this arrangement, the configuration of the material gas diffusion chamber may be designed to match the configuration of the shower plates so that the gas is more uniformly diffused into the material gas diffusion chamber. Further, although in the figures the material gas diffusion chamber is shown to be rectangular, it may have another polygonal shape or a circular shape.

The material gas diffusion chamber 135 has material gas spray holes 136 which also extend to the bottom surface of the shower head unit 13. In this case, the conductance of the spray holes is preferably small to ensure that the material gas is uniformly sprayed into the vacuum chamber. For example, in the apparatus shown in FIGS. 1 and 2, the material gas spray holes 136 have a diameter $\phi$ of approximately 0.7-1 mm and a depth of approximately 10 mm to uniformly deliver the material gas into the vacuum chamber.

The reactive gas spray holes 132 also extend to the bottom surface of the shower head unit 13. That is, the reactive gas spray holes 132 and the material gas spray holes 136 are arranged at regular intervals in a matrix fashion in the bottom surface of the shower head unit 13, ensuring that the material gas and reactive gas are uniformly applied onto the substrate. The pitch (center-to-center spacing) of the material gas spray holes 136 and the pitch of the reactive gas spray holes 132 are equal (e.g., 14 mm). In this case, the reactive gas spray holes 132 has a greater diameter than the material gas spray holes 136; for example, the diameter of the material gas spray holes 136 is 1 mm and that of the reactive gas spray holes 132 is 5 mm. The reason for this is that the flow rate of the reactive gas is greater than that of the material gas in the modification process.

In the shower head unit 13 configured as described above, the reactive gas that has been introduced from the nonmetallic pipe 111 into the shower head unit 13 through the reactive gas introduction chamber 12 spreads to fill the reactive gas diffusion chamber 131 and is then introduced into the vacuum chamber through the reactive gas spray holes 132. The material gas, on the other hand, is introduced from the material gas introduction tube 133 into the center portion of the gas path 134a of the gas path 134 and passes equally through the right and left branches of the gas path 134a and diffuses into the gas paths 134*b* of the lower stage through the connection holes 134*c*. The material gas then passes equally through the right and left branches of the gas paths 134*b* and diffuses uniformly into the material gas diffusion chamber 135 through the connection holes 134*d*. The material gas is then discharged uniformly into the vacuum chamber through the material gas spray holes 136 in the bottom surface of the material gas diffusion chamber 135.

Incidentally, since the raw material for the material gas thermally decomposes at above 60° C., it must be gasified and delivered at not more than 60° C. Therefore, the material gas introduction apparatus is preferably constructed as shown in FIG. 4 or 5. Such material gas introduction apparatuses will be described with reference to FIGS. 4 and 5.

FIGS. 4(*a*) and 4(*b*) are schematic diagrams showing the configurations of material gas introduction apparatuses 15. The material $Zr(BH_4)_4$ is preferably maintained at $-10°$ C. to 25° C. (lower than its melting point, namely, 28.7° C.), more preferably $-5°$ C. to 5° C. The reason for this is as follows: $Zr(BH_4)_4$ thermally decomposes into $ZrB_2$ and $B_2H_6$ in the material tank at above 25° C. since it has very low thermal stability. Further, the vapor pressure of $Zr(BH_4)_4$ is lower than 2 mm Hg at less than $-10°$ C., meaning that $Zr(BH_4)_4$ is not suitable as a material for ALD at less than $-10°$ C. since its vapor pressure is too low. One exemplary gas introduction method, which uses the material gas introduction apparatus shown in FIG. 4(*a*), proceeds as follows. A fine mesh 152 is mounted in a tank 151 maintained at, e.g., 0° C. (corresponding to a vapor pressure of 3.7 mm Hg), and a granular material 153 is placed on the mesh. An inert gas, such as Ar or He, serving as a bubbling gas is supplied to the lower portion of the inside of the tank 151 through a mass flow controller 154, so that the inert gas flows through the material 153 in the direction from below the mesh 152 and to above the mesh 152. The material 153 is sublimated by this bubbling, and the sublimated material together with the bubbling gas is introduced into the material gas diffusion chamber 135 through the material gas introduction tube 133. Another exemplary gas introduction method, which uses the material gas introduction apparatus shown in FIG. 4(*b*), proceeds as follows. A granular material 153 is held between two meshes 152*a* and 152*b* mounted in a tank 151 maintained at approximately 0° C. An inert gas, such as Ar or He, serving as a bubbling gas is delivered into the tank 151 through a mass flow controller 154 so that the bubbling gas flows through the material in the direction from the mesh 152*a* to the mesh 152*b*. The material 153 is sublimated by this bubbling, and the sublimated material together with the bubbling gas is introduced into the material gas diffusion chamber 135 through the material gas introduction tube 133 and the gas path 134.

FIG. 5 shows another material gas introduction apparatus 15 using a low differential pressure mass flow. A material gas introduction method using the material gas introduction apparatus shown in FIG. 5 proceeds as follows. A material 153 is introduced into a tank 151 maintained at, e.g., approximately 0° C. (corresponding to a vapor pressure of 3.7 mm Hg). The gas derived from the material 153 is then introduced into the material gas diffusion chamber 135 through the material gas introduction tube 133 and the gas path 134, with its flow rate being directly regulated by a mass flow controller 154 (a low differential pressure mass controller). In this case, when the material gas is introduced into the chamber, the pressure in the chamber must be lower than the vapor pressure of the material gas. For example, when the material tank is cooled and maintained at 0° C., the vapor pressure of the material gas is 3.7 mm Hg. Therefore, the chamber pressure must be lower than 3.7 mm Hg.

A substrate to be coated is placed on the substrate stage which is disposed in the vacuum chamber and which faces the above shower head structure 1, and this substrate is coated with a $ZrB_2$ barrier film. Suitable examples of such substrates include those with high aspect ratio fine holes, trenches, etc. formed as follows. An insulating film such as a P—SiO film, a BPSG film, or an HDP-PSG film, or a low dielectric constant film such as a P—SiOC film or a porous Low-k film, is formed on a starting substrate commonly used in semiconductor devices, such as an Si substrate. The formed film is then etched under ordinary etching conditions to form the high aspect ratio fine holes, trenches, etc. The present invention allows a high quality barrier film to be formed by ALD in such a manner that the barrier film fully and closely covers the inner surfaces of these holes, etc. without any overhang above these features.

A method of the present invention for forming a barrier film using the first coating apparatus provided with the above shower head structure 1 proceeds as follows. An object to be coated, i.e., a substrate having an insulating film with holes and trenches formed therein, is placed in the vacuum chamber. Then by using ALD, a material gas composed of $Zr(BH_4)_4$ gas is reacted, over the surface of the object to be coated, with a gas obtained as a result of exciting a reactive gas composed of $H_2$ gas by plasma, thereby forming a barrier film made of a $ZrB_2$ film on the insulating film and on the inner surfaces of the holes and trenches. In this case, the barrier film is formed on the object to be coated while its substrate is maintained at a temperature between 50° C. and 300° C. inclusive, preferably between 150° C. and 200° C. inclusive. The reason for this is that no barrier film can be formed at substrate temperatures lower than 50° C. and that barrier films formed at substrate temperatures higher than 300° C. cannot achieve good coverage.

The process sequence indicated by the timing chart shown in FIG. 6 is suitable for the method of the present invention for forming a film using ALD.

The evacuating system for the coating apparatus used to implement the present invention may be a two stage vacuum pump system (not shown) including an Ulvac dry pump, model PDR-90-CH (evacuation rate: 1500 L/min) (not shown) and an Ebara turbo molecular pump, model TMP-1003LM (evacuation rate: 1080 L/sec). In this case, a butterfly type pressure control valve available from MKS Instruments, Inc. is preferably connected between the reaction chamber and the turbo molecular pump to control the pressure in the reaction chamber by varying the travel of the butterfly valve.

First, after placing an object to be coated within the vacuum chamber, the pressure in the vacuum chamber is maintained constant (e.g., 1 Torr or more, preferably 3 Torr or more) and the object to be coated is heated to a predetermined temperature (50-300° C.). Next, an ALD deposition process is initiated. First, only $H_2$ gas serving as a reactive gas is passed through the nonmetallic pipe 111 at a flow rate of approximately 1-100 sccm, with the evacuation rate increased (i.e., the butterfly valve being fully opened with a valve opening of 100%). The flowing of $H_2$ gas serving as a reactive gas at a rate of approximately 1-100 sccm prevents the material gas from flowing back into the reactive gas pipe line.

The process then proceeds to an adsorption step. The shower head unit 13 is operated as shown in FIG. 7. Specifically, reactive gas G1 is passed through the nonmetallic pipe 111 and the reactive gas introduction chamber 12 to the reactive gas diffusion chamber 131 of the shower head unit 13 and then introduced into the vacuum chamber through the reactive gas spray holes 132. It should be noted that the reactive gas G1 is not in a plasma state in the adsorption step, in which a microwave is not generated. With the flow rate of the $H_2$ gas, i.e., reactive gas G1, maintained at 1-100 sccm, $Zr(BH_4)_4$ gas, i.e., material gas G2, is introduced from the material gas introduction tube 133 into the vacuum chamber through the material gas diffusion chamber 135 and the material gas spray holes 136 such that the $Zr(BH_4)_4$ gas is adsorbed on the object to be coated.

When the material gas is introduced in this adsorption step, if the material gas introduction apparatus 15 shown in FIG. 4(a) or 4(b) is used to indirectly control the flow rate of the $Zr(BH_4)_4$ gas (i.e., the material gas) using an inert gas (Ar, He, etc.) as a bubbling gas, then the bubbling gas is introduced at a flow rate of 10-500 sccm. That is, if the flow rate is lower than 10 sccm, no film can be formed since the amount of contained material is too small. Further, if the flow rate is higher than 500 sccm, a film is not efficiently formed since the amount of contained material is too large. In this case, the pressure in the chamber is preferably maintained at 10 Torr or less. The reason for this is that it takes considerable time to adjust the pressure in the vacuum chamber to above 10 Torr, meaning that such a method is not suitable for ALD.

On the other hand, if the apparatus shown in FIG. 5 using a low differential pressure mass flow is used to directly control the flow rate of the material gas when the material gas is introduced, then the flow rate of the material gas is maintained at 1-100 sccm. That is, if the flow rate of the material gas is lower than 1 sccm, the resulting deposition rate is practically too low since the amount of material gas available for the deposition is too small. Further, if the flow rate is higher than 100 sccm, the amount of material consumed is too large, meaning that the process is not practical commercially. In this case, since $Zr(BH_4)_4$ gas has low thermal stability, the raw material $Zr(BH_4)_4$ is maintained at a temperature of $-10°$ C. to $25°$ C., preferably $-5°$ C. to $5°$ C. Therefore, the chamber pressure is maintained at 10 Torr or less, taking into account the vapor pressures of $Zr(BH_4)_4$ gas at these temperatures. The chamber pressure is preferably 2 Torr or less, more preferably 0.1 Torr or less.

The pressure applied in the adsorption step is controlled by adjusting the travel of the pressure control valve while introducing the material gas $Zr(BH_4)_4$ (and a bubbling gas, if it is used) into the vacuum chamber, with the flow of the $H_2$ gas serving as a backflow prevention reactive gas being maintained.

The supply of the material gas $Zr(BH_4)_4$ (and the bubbling gas, if it is used) to the vacuum chamber is shut off after a predetermined period of time following its initial operation, thus ending the adsorption step. The flow of the backflow prevention $H_2$ gas (reactive gas) is not shut off and still maintained. Concurrently with the shut off of the supply of the material gas, the pressure control valve is fully opened with a valve opening of 100% to establish a sufficiently evacuated state. A modification step is initiated when the pressure in the vacuum chamber has been reduced to a predetermined value below the pressure at which the material gas was introduced in the adsorption step.

At the beginning of the modification step, the flow rate of the $H_2$ gas serving as the reactive gas, which is introduced continuously from the previous adsorption step, is varied to 10-500 sccm, and the chamber pressure is adjusted to a predetermined pressure by adjusting the travel of the pressure control valve. Further, at the same time, a microwave is generated. In this case, when the oscillation frequency (or resonant frequency) of the microwave is, e.g., 2.45 GHz, the input power must be 0.1-5 kW. If the input power is lower than 0.1 kW, the plasma power is low and not sufficient. If the plasma power is higher than 5 kW, on the other hand, considerable damage to the electrical discharge tube may result.

FIG. 8 shows the operating state of the apparatus in this modification step. In this step, the reactive gas G1 is still introduced, although the supply of the material gas G2 remains shut off. The microwave generated by the magnetron 141 powered by the microwave power supply 142 is transmitted within the coaxial resonant cavity 11 through the antenna 143 so that the reactive gas G1 in the region inside the exposed portion 111a of the nonmetallic pipe 111 is converted into a plasma state, with the result that the reactive gas G1 is excited. The excited reactive gas G1 (renamed as the reactive gas G3) is introduced into the reactive gas introduction chamber 12 and the reactive gas diffusion chamber 131 of the shower head unit 13. The reactive gas G3 is then introduced into the vacuum chamber through the reactive gas diffusion chamber 131 and the reactive gas spray holes 132, so that the reactive gas reacts with the material gas adsorbed on the object to be coated, thus modifying the film.

In this modification step, the pressure in the vacuum chamber is preferably maintained at 10 Torr or less. The reason for this is that it takes considerable time to adjust the pressure in the chamber to above 10 Torr, meaning that such a method is not suitable for ALD.

The oscillation of the microwave is terminated after a predetermined period of time, thus ending the modification step. Upon the ending of the modification step, the flow rate of the $H_2$ gas serving as the reactive gas is changed to 1-100 sccm, so that the gas only acts as a backflow prevention gas. Furthermore, the pressure control valve is fully opened with a valve opening of 100% to establish a sufficiently evacuated state. An adsorption step is initiated again when the pressure in the vacuum chamber has been reduced to a predetermined value below the pressure in the previous modification step.

Such adsorption and modification steps may be repeated a few to a few hundreds of times to form a barrier film having the desired thickness.

The process sequence indicated by the timing chart shown in FIG. 9 is also suitable for the method of the present invention for forming a film using ALD. The timing chart of FIG. 9 will now be described.

First, after placing an object to be coated within the vacuum chamber, the pressure in the vacuum chamber is maintained constant (e.g., 1 Torr ore more, preferably 3 Torr or more) and the object to be coated is heated to a predetermined temperature (50-300° C.) Next, an ALD deposition process is initiated.

First, $H_2$ gas serving as a reactive gas is introduced into the nonmetallic pipe 111 at a flow rate of 1-100 sccm, and the travel of the pressure valve is adjusted to adjust the pressure to a predetermined level. Further, at the same time, a microwave is generated by the microwave supply means 14 to produce plasma. Then, an adsorption step is initiated while the plasma from the reactive gas exists as hydrogen radicals. Also in this adsorption step, $H_2$ gas serving as a reactive gas is introduced at a flow rate of 1-100 sccm, and a microwave is generated to produce hydrogen radicals. The reason for this is that the introduction of the reactive gas prevents the material gas from flowing back into the reactive gas pipe line and that the hydrogen radicals will react with the $Zr(BH_4)_4$ gas over the substrate also in the adsorption step so as to improve the film quality, minimize the time required for evacuation in the adsorption and modification steps, and increase the throughput. In this case, the hydrogen radicals might mix with the material gas $Zr(BH_4)_4$ when they are in the vapor phase, causing a CVD phenomenon. This may reduce step coverage of fine holes. To avoid this, the object to be coated is maintained at reduced temperature (50-300° C.) to limit the CVD phenomenon in the vapor phase.

When the oscillation frequency (or resonant frequency) of the microwave is, e.g., 2.45 GHz, the input power must be 0.1-5 kW. If the input power is lower than 0.1 kW, the plasma power is low and not sufficient. If the plasma power is higher than 5 kW, on the other hand, considerable damage to the electrical discharge tube may result.

The adsorption step is initiated by introducing $Zr(BH_4)_4$ gas serving as the material gas into the material gas introduction tube 133. The material gas is then introduced into the vacuum chamber through the material gas diffusion chamber 135 and the material gas spray holes 136 so that the material gas is adsorbed on the object to be coated. Specifically, in the adsorption step, the shower head structure 1 is operated, as shown in FIG. 10, so that reactive gas G1 is converted into a plasma state by the generation of the microwave while it is passed through the nonmetallic pipe 111 and that the reactive gas in the plasma state (renamed as the reactive gas G3) is introduced into the vacuum chamber through the reactive gas introduction chamber 12 and the reactive gas spray holes 132.

When the material gas is introduced in this adsorption step, if the material gas introduction apparatus 15 shown in FIG. 4(a) or 4(b) is used to indirectly control the flow rate of the $Zr(BH_4)_4$ gas (i.e., the material gas) using an inert gas (Ar, He, etc.) as a bubbling gas, then the flow rate of the bubbling gas is varied over a range of 10-500 sccm to indirectly control the flow rate of the $Zr(BH_4)_4$ gas. In this case, the chamber pressure is preferably maintained at 10 Torr or less. The reason for this is that it takes considerable time to adjust the pressure in the chamber to above 10 Torr, meaning that such a method is not suitable for ALD.

On the other hand, if the material gas introduction apparatus 15 shown in FIG. 5 using a low differential pressure mass flow is used to directly control the flow rate of the material gas when the material gas is introduced, then the flow rate of the material gas is maintained at 1-100 sccm. That is, if the flow rate of the material gas is lower than 1 sccm, the resulting deposition rate is practically too low. Further, if the flow rate is higher than 100 sccm, the amount of material consumed is extremely large, meaning that the process is not practical commercially. In this case, since $Zr(BH_4)_4$ gas has low thermal stability, the raw material $Zr(BH_4)_4$ is maintained at a temperature of −10° C. to 25° C., preferably −5° C. to 5° C. Therefore, taking into account the vapor pressures of $Zr(BH_4)_4$ gas at these temperatures, the chamber pressure is maintained at 10 Torr or less, preferably 2 Torr or less, more preferably 0.1 Torr or less.

The pressure applied in the absorption step is controlled by adjusting the travel of the pressure control valve while introducing the material gas $Zr(BH_4)_4$ (and a bubbling gas, if it is used) into the vacuum chamber, with the flow of the $H_2$ gas serving as a backflow prevention reactive gas being maintained.

The supply of the material gas $Zr(BH_4)_4$ (and the bubbling gas, if it is used) to the vacuum chamber is shut off after a predetermined period of time following its initial operation, thus ending the adsorption step. At that time, neither the supply of the reactive gas $H_2$ nor the oscillation of the microwave is stopped.

Upon shut off of the supply of the material gas, the process to a modification step. Alternatively, concurrently with the shut off of the supply of the material gas, the pressure control valve may be fully opened with a valve opening of 100% to establish a sufficiently evacuated state. Then, a modification step may be initiated when the pressure in the vacuum chamber has been reduced to a predetermined value below the pressure at which the material gas was introduced in the adsorption step, as described with reference to FIG. 6.

At the beginning of the modification step, the flow rate of the $H_2$ gas serving as the reactive gas, which is introduced continuously from the previous adsorption step, is varied to 10-500 sccm, and the chamber pressure is adjusted to a predetermined pressure by adjusting the travel of the pressure control valve. FIG. 8 shows the operating state of the apparatus in this modification step. In this step, the reactive gas G1 is still introduced, although the supply of the material gas G2 remains shutoff. The microwave still generated by the magnetron 141 powered by the microwave power supply 142 is transmitted within the coaxial resonant cavity 11 through the antenna 143 so that the reactive gas in the region inside the exposed portion 111a of the nonmetallic pipe 111 is converted into a plasma state, with the result that the reactive gas G1 is excited. The excited reactive gas G1 (renamed as the reactive gas G3) is introduced into the reactive gas introduction chamber 12 and the reactive gas diffusion chamber 131 of the shower head unit 13. The reactive gas G3 is then introduced into the vacuum chamber through the reactive gas diffusion chamber 131 and the reactive gas spray holes 132, so that the reactive gas reacts with the material gas adsorbed on the object to be coated, thus modifying the film. The pressure in the vacuum chamber in the modification step is as indicated in FIG. 6.

After a predetermined period of time, the flow rate of the $H_2$ gas serving as the reactive gas is changed to 1-100 sccm and at the same time $Zr(BH_4)_4$ gas serving as a material gas is introduced, with the oscillation of the microwave still being maintained. Further, the travel of the pressure control valve is adjusted to adjust the pressure in the chamber to a predetermined pressure for an adsorption step, thus ending the modification step and initiating the next adsorption step.

Such adsorption and modification steps may be repeated a few to a few hundreds of times to form a barrier film having the desired thickness.

In the modification step of either process described above, the reactive gas may be a mixture of $H_2$ gas and at least one of $N_2$ and $NH_3$, a mixture of $H_2$ gas and $N_2$ and/or $NH_3$, or a mixture of $H_2$ gas and an inert gas (Ar, He, etc.) in order to maintain the reactive gas in a radical state for a longer period. When the $H_2$ gas is mixed with $N_2$ and/or $NH_3$, the resultant barrier film (the final product) is a ZrBN film. The flow rate of each gas mixed with the $H_2$ gas in the modification step can be varied over a range of 10-500 sccm, as in the case of the $H_2$ gas. However, the total flow rate of the gases introduced in the modification step is determined depending on the apparatus used, taking into account its evacuation capability and the load on the vacuum pump. The total flow rate of the reactive gas is preferably approximately 10-1000 sccm.

As described above, the barrier film formed is a ZrBN film. The reason for this is that the Zr—N bond is more stable than the Zr—B bond, meaning that Zr—N bonds are formed when the reactive gas includes nitrogen radicals or ammonia radicals in addition to hydrogen radicals excited by plasma. Therefore, increasing the ratio of the $NH_3$ gas or $N_2$ gas to the $H_2$ gas results in an increase in the proportion of Zr—N bonds in the ZrBN film. That is, the quality of the ZrBN film changes with the flow rate ratio of the $NH_3$ or $N_2$ gas to the $H_2$ gas.

Further, $B_2H_6$ may be introduced into a gas introduction inlet 137 provided in the reactive gas diffusion chamber 131 at 10-1000 sccm. That is, the $Zr(BH_4)_4$ can be prevented from decomposition and hence stabilized by introducing a large amount of $B_2H_6$ into the chamber, since $B_2H_6$ is a product resulting from the thermal decomposition of $Zr(BH_4)_4$.

There will be described a second coating apparatus used in a method of forming a film according to the present invention.

FIG. 11 is a schematic diagram of a second shower head structure 2 used in the second coating apparatus. In FIG. 11 components common to FIG. 1 are denoted by the same reference numerals. In the case of the first coating apparatus shown in FIG. 1, if a considerable number of substrates are processed and coated in the apparatus, the inside of the nonmetallic pipe 111 may be etched as shown by the SEM photograph of FIG. 12. To prevent this etching of the inside of the nonmetallic pipe 111, the shower head structure 2 of the second coating apparatus includes at least one cooling means which is not included in the shower head structure 1 of the first coating apparatus. Specifically, the second shower head structure 2 differs from the first shower head structure 1 in that it includes cooling gas introduction means 21 for cooling the inside of the coaxial resonant cavity and that the nonmetallic pipe 111 is replaced by a nonmetallic double pipe 22 (e.g., of alumina or quartz) which forms a passage capable of passing a cooling fluid therethrough. It should be noted that the second shower head structure 2 may include only one of these cooling means. The differences of the second shower head structure 2 from the first shower head structure 1 will be described.

The cooling gas introduction means 21 includes a gas source 211, a gas tube 212 connected to the gas source 211, and a valve 213 provided in the gas tube 212, and is connected to the coaxial resonant cavity 11. The coaxial resonant cavity 11 can be filled with a cooling gas introduced through the cooling gas introduction means 21. The cooling gas is discharged from the cavity by exhaust means, not shown, and circulated. This makes it possible to maintain the temperature in the coaxial resonant cavity 11 constant and to cool the double pipe 22 around its exposed portion 111a.

The cooling gas introduced from the gas source 211 into the coaxial resonant cavity 11 is a harmless cooling gas that can be discharged into the clean room, for example, it may be dry $N_2$ gas, dry Ar gas, dry He gas, or dry $O_2$ gas.

The double pipe 22 will now be described with reference to FIG. 13. FIG. 13(a) is a vertical cross-sectional view of the double pipe 22, FIG. 13(b) is a cross-sectional view taken along line A-A' of FIG. 13(a), and FIG. 13(c) is a cross-sectional view taken along line B-B' of FIG. 13(b). As shown in FIG. 13(a), the double pipe 22 has double sidewalls, and the outer sidewall 221 internally defines and forms a cooling fluid passage 222. A fluid inlet 223 and a fluid outlet 224 are provided on the upper wall of the cooling fluid passage 222. Further, two partition plates 225 are inserted into the cooling fluid passage 222, as shown in FIG. 13(b). Each partition plate 225 has an opening 226 formed in its lower portion, as shown in FIG. 13(c). With this arrangement, the upstream portion 222a of the cooling fluid passage 222 on the same side thereof as the fluid inlet 223 communicates with the downstream portion 222b of the cooling fluid passage 222 on the same side thereof as the fluid outlet 224. As a result, the liquid introduced through the fluid inlet 223 flows downward through the upstream portion 222a of the cooling fluid passage 222 and enters the downstream portion 222b through the openings 226. The liquid then flows upward through the downstream portion 222b thereby filling it and then flows from within the sidewall 221 through the fluid outlet 224. Thus, the cooling fluid passage 222 covers the substantially entire outer circumferential surface of the gas passage 227 in the double pipe, making it possible to cool the gas passage from top to bottom. It should be noted that although in the figure the fluid inlet 223 and the fluid outlet 224 are shown to be provided on the top surface of the double pipe 22, they may be provided on the side of the double pipe 22.

In this case, the cooling fluid must be a fluid medium that does not resonate at the oscillation frequency of the microwave. For example, when the oscillation frequency is 2.45 GHz, suitable examples of cooling fluids include those available under the trade names Fluorinert FC-87, FC-72, FC-84, FC-77, FC-75, FC-3283, FC-40, FC-43, FC-70, and FC-5312 from 3M Corporation, and Galden® from Ausimont. Suitable examples also include ethylene glycol and ethylene glycol-based liquid media and include gases such as dry $N_2$ gas, dry Ar gas, dry He gas, and dry $O_2$ gas.

Thus, the second coating apparatus includes the cooling gas introduction means 21 and/or the double pipe 22 to prevent etching of the inner surface of the gas passage 27 in the double pipe 22, as well as to prevent thermal deactivation of radicals such as hydrogen radicals in the plasma generated in the region inside the exposed portion 111a. This makes it possible to increase the generation efficiency of radicals and to efficiently perform ALD.

The second coating apparatus can be used to implement the ALD method of the present invention using a procedure similar to that for the first coating apparatus. In this case, during the entire ALD process, a cooling gas is introduced by the cooling gas introduction means 21 and/or the gas passage 227 is cooled by use of the double pipe 22. Such cooling during the ALD process prevents etching of the inner surface of the gas passage 227, such as that shown in FIG. 12, and increases the generation efficiency of hydrogen radicals. In this case, an increase in the generation efficiency of radicals such as hydrogen radicals does not result in etching of the inner surface of the gas passage 227, since its inner wall is sufficiently cooled.

The method of forming a film according to the present invention will now be described in detail with reference to practical examples.

PRACTICAL EXAMMPLE 1

In this example, a film was formed in the first coating apparatus using the process sequence shown in FIG. 6. The parameters in the adsorption step were set as follows: time=5 sec; flow rate of reactive gas ($H_2$ gas)=100 sccm; flow rate of bubbling gas (Ar) for material gas [$Zr(BH_4)_4$ gas]=100 sccm; and evacuation rate=1000 L/sec. The parameters in the modification step were set as follows: time=25 sec; reactive gas flow rate=100 sccm; microwave input power=0.5 kW; and evacuation rate=1000 L/sec. These adsorption and modification steps were each repeated 24 times to form a film on a substrate S. The resultant film was a $ZrB_2$ film having a thickness of 10 μm.

PRACTICAL EXAMPLE 2

In this example, a film was formed in the first coating apparatus using the process sequence shown in FIG. 9. The parameters in the adsorption step were set as follows: time=5 sec; flow rate of reactive gas ($H_2$ gas)=100 sccm; flow rate of bubbling gas (Ar) for material gas [$Zr(BH_4)_4$ gas]=100 sccm; microwave input power=0.5 kW; and evacuation rate=1000 L/sec. The parameters in the modification step were set as follows: time=25 sec; reactive gas flow rate=100 sccm; microwave input power=0.5 kW; and evacuation rate=1000 L/sec. These adsorption and modification steps were each repeated 24 times to form a film on a substrate S. The resultant film was a $ZrB_2$ film having a thickness of 10 μm.

PRACTICAL EXAMPLE 3

In this example, a film was formed in the second coating apparatus using the process sequence shown in FIG. 6. The parameters in the adsorption step were set as follows: time=5 sec; flow rate of reactive gas ($H_2$ gas)=100 sccm; flow rate of bubbling gas (Ar) for material gas [$Zr(BH_4)_4$ gas]=100 sccm; and evacuation rate=1000 L/sec. The parameters in the modification step were set as follows: time=25 sec; reactive gas flow rate=100 sccm; microwave input power=0.5 kW; and evacuation rate=1000 L/sec. These adsorption and modification steps were each repeated 24 times to form a film on a substrate S. Further, the inside of the coaxial resonant cavity 11 and the double pipe 22 were cooled during this deposition process. The resultant film was a $ZrB_2$ film having a thickness of 10 μm, and etching of the inner surface of the gas passage 227, such as that shown in FIG. 12, was prevented.

PRACTICAL EXAMPLE 4

In this example, a film was formed in the first coating apparatus using the process sequence shown in FIG. 6. The parameters in the adsorption step were set as follows: time=5 sec; flow rate of reactive gas ($H_2$ gas mixed with $N_2$ gas)=100 sccm; flow rate of bubbling gas (Ar) for material gas [$Zr(BH_4)_4$ gas]=100 sccm; and evacuation rate=1000 L/sec. The parameters in the modification step were set as follows: time=25 sec; reactive gas flow rate=100 sccm; microwave input power=0.5 kW; and evacuation rate=1000 L/sec. These adsorption and modification steps were each repeated 24 times to form a film on a substrate S. The resultant film was a ZrBN film having a thickness of 10 μm.

INDUSTRIAL USABILITY

The present invention performs adsorption and reaction steps at low temperature in an apparatus suitable for ALD such that a barrier film made of a $ZrB_2$ film or ZrBN film is formed to fully and closely cover high aspect ratio fine holes, trenches, etc. without any overhang above these features. Therefore, the present invention is useful in semiconductor technology.

BRIEF DESCRIPTION OF THE DRAWINGS

FIGS. 13(a) to 13(c) are schematic cross-sectional views illustrating a double pipe 22, wherein: FIG. 13(a) is a vertical cross-sectional view of the double pipe 22; FIG. 13(b) is a cross-sectional view taken along line A-A' of FIG. 13(a); and FIG. 13(c) is a cross-sectional view taken along line B-B' of FIG. 13(b).

DESCRIPTION OF REFERENCE NUMERALS

Figure 1:
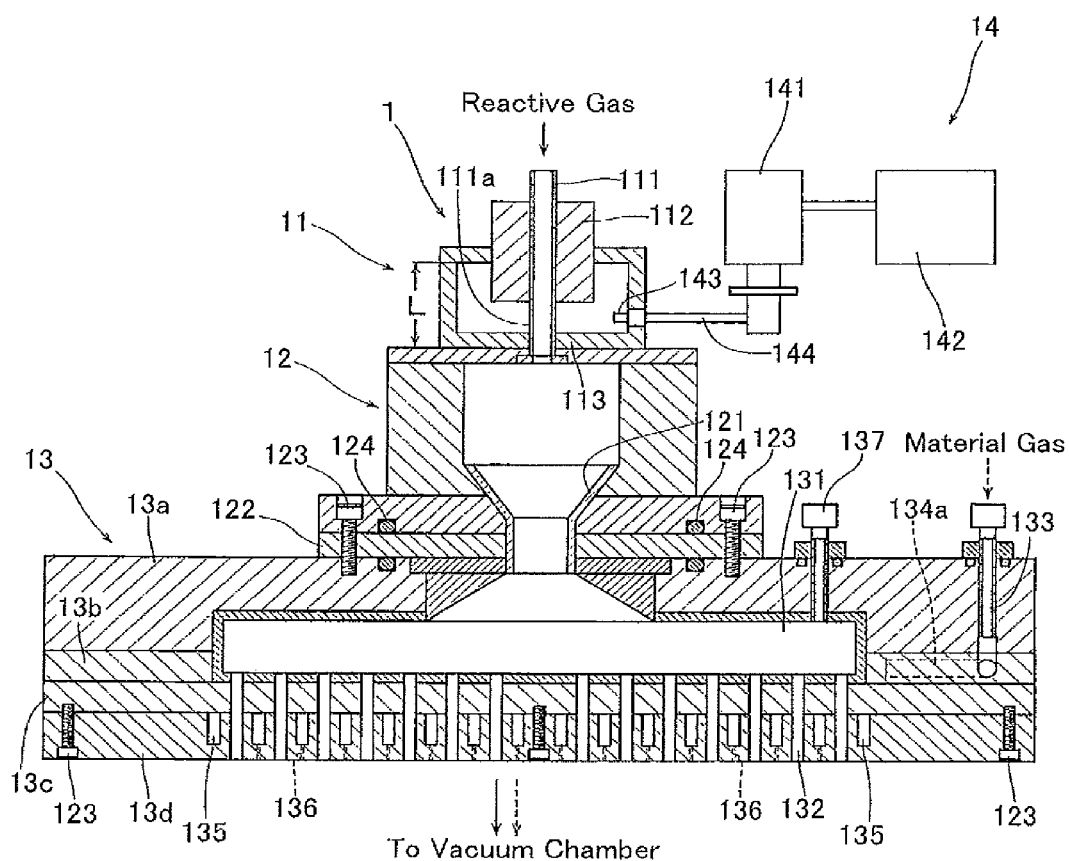
FIG. 1 is a schematic cross-sectional view illustrating the shower head structure 1 of a coating apparatus according to an embodiment of the present invention.
Figure 2A:
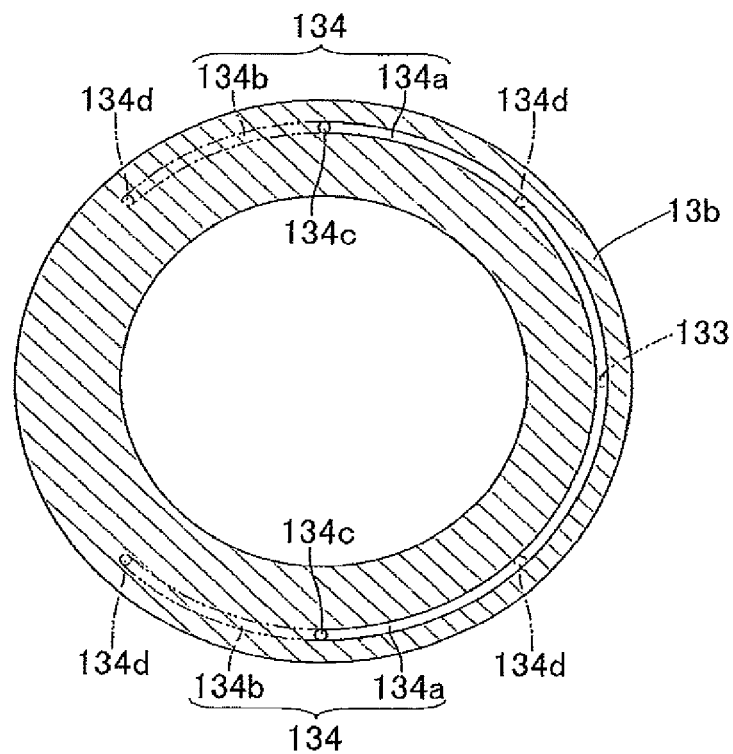
FIGS. 2(a), 2(b), and 2(c) are horizontal cross-sectional views of a ring-like member 13b, a first shower plate 13c, and a second shower plate 13d, respectively.
Figure 2B:
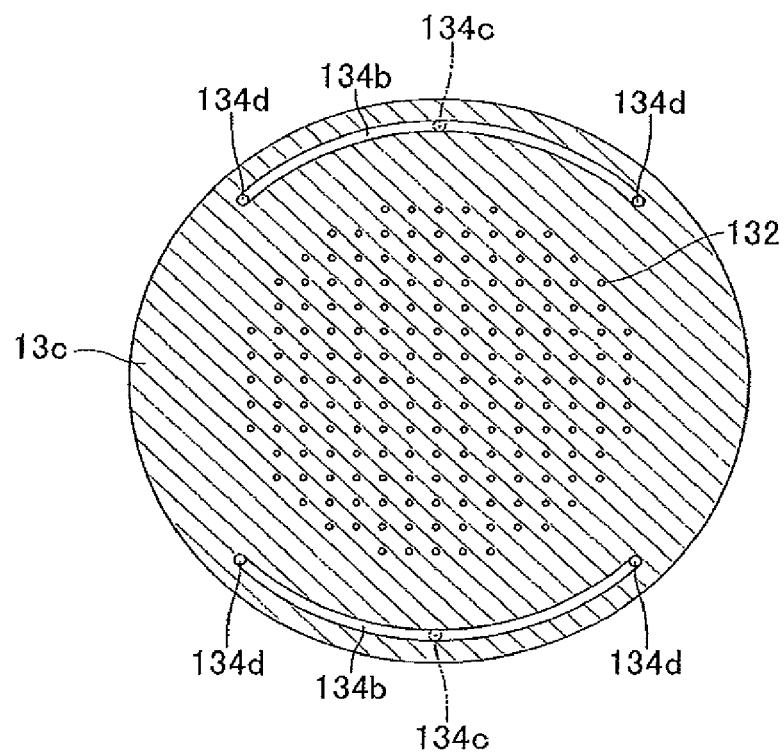
Figure 2C:
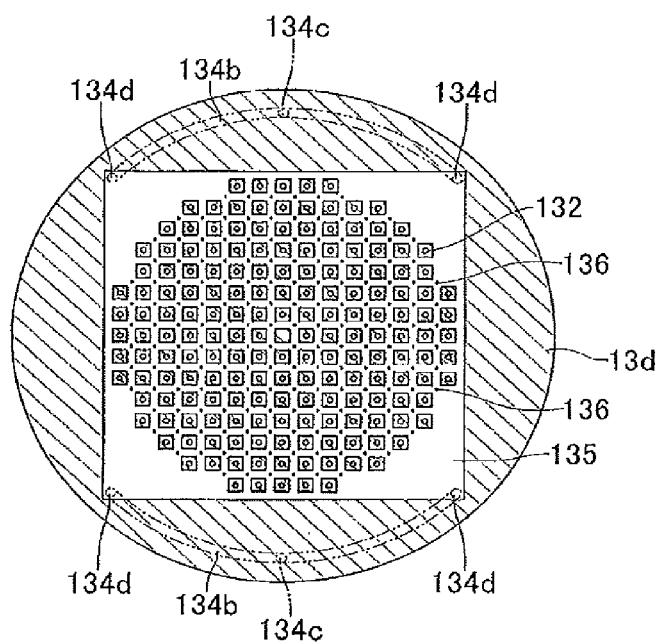
Figure 3:
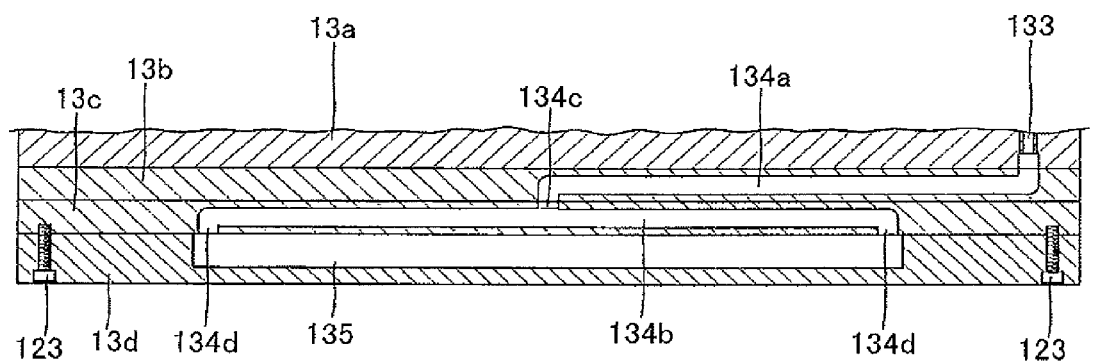
FIG. 3 is a schematic diagram illustrating the positional relationship between a material gas introduction tube 133, a gas path 134, and a material gas diffusion chamber 135.
Figure 4A:
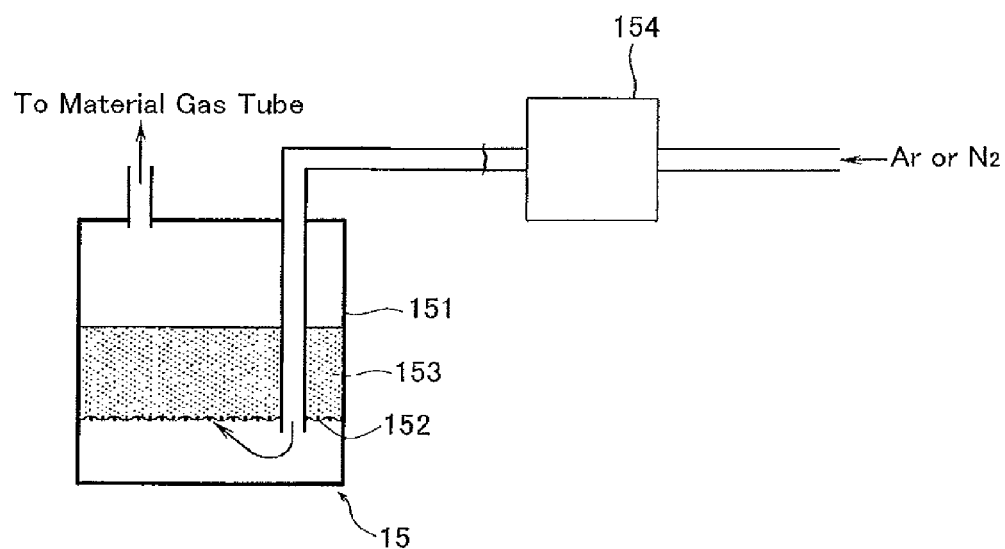
FIGS. 4(a) and 4(b) are configuration diagrams schematically illustrating alternative methods of generating a material gas according to the present invention.
Figure 4B:
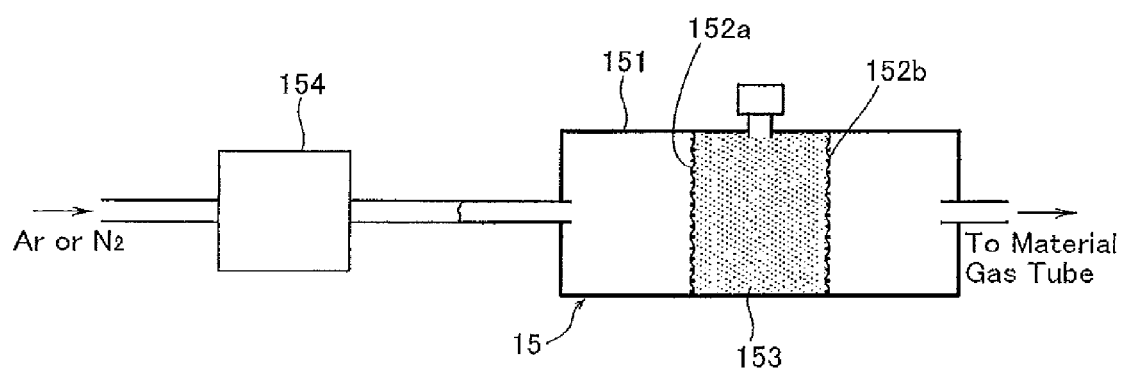
Figure 5:
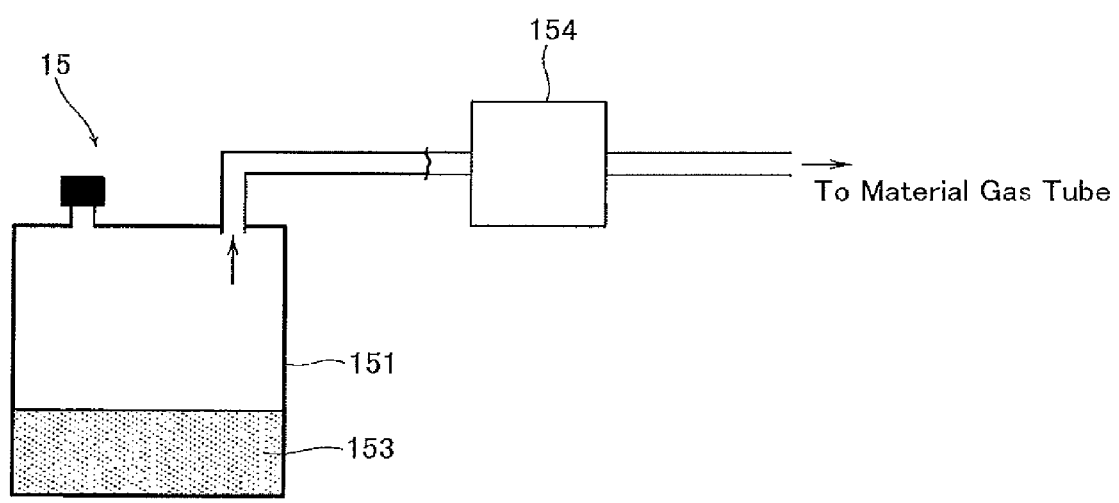
FIG. 5 is a configuration diagram schematically illustrating another alternative method of generating a material gas according to the present invention.
Figure 6:
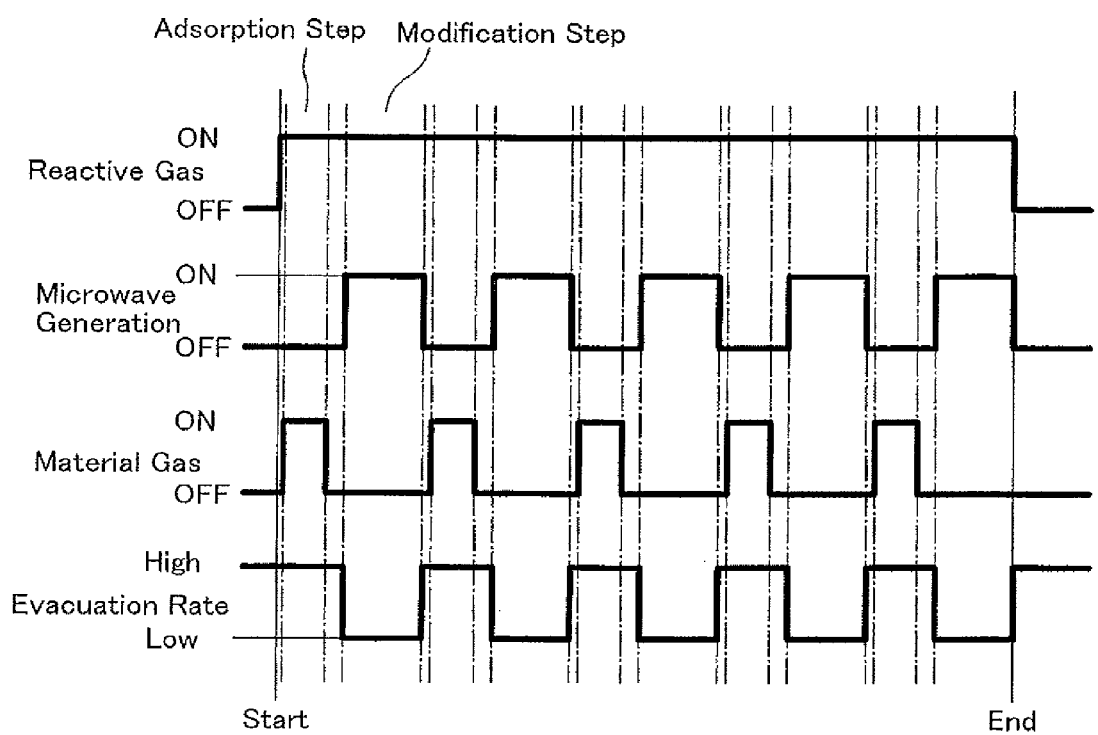
FIG. 6 is a graph showing a process sequence according to the embodiment of the present invention.
Figure 7:
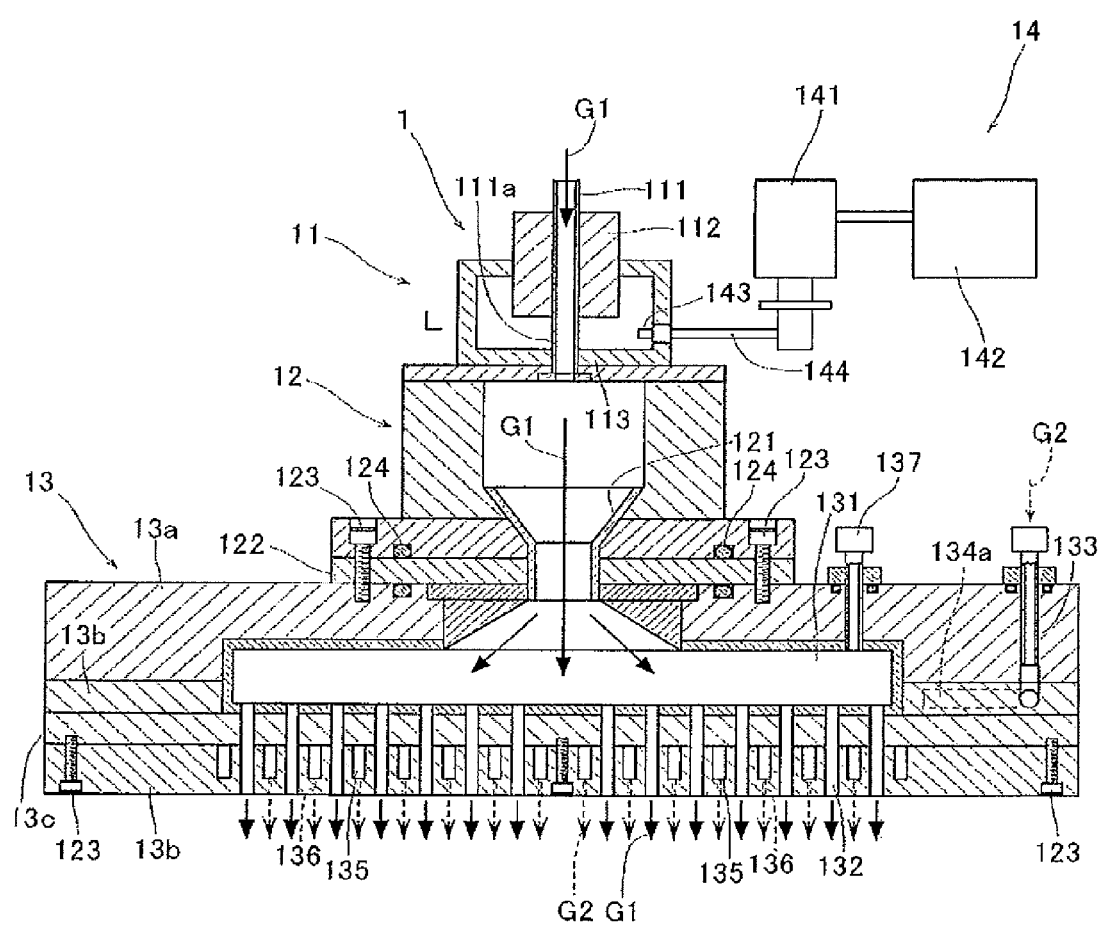
FIG. 7 is a configuration diagram schematically illustrating the operation of the shower head structure 1 in an adsorption step.
Figure 8:
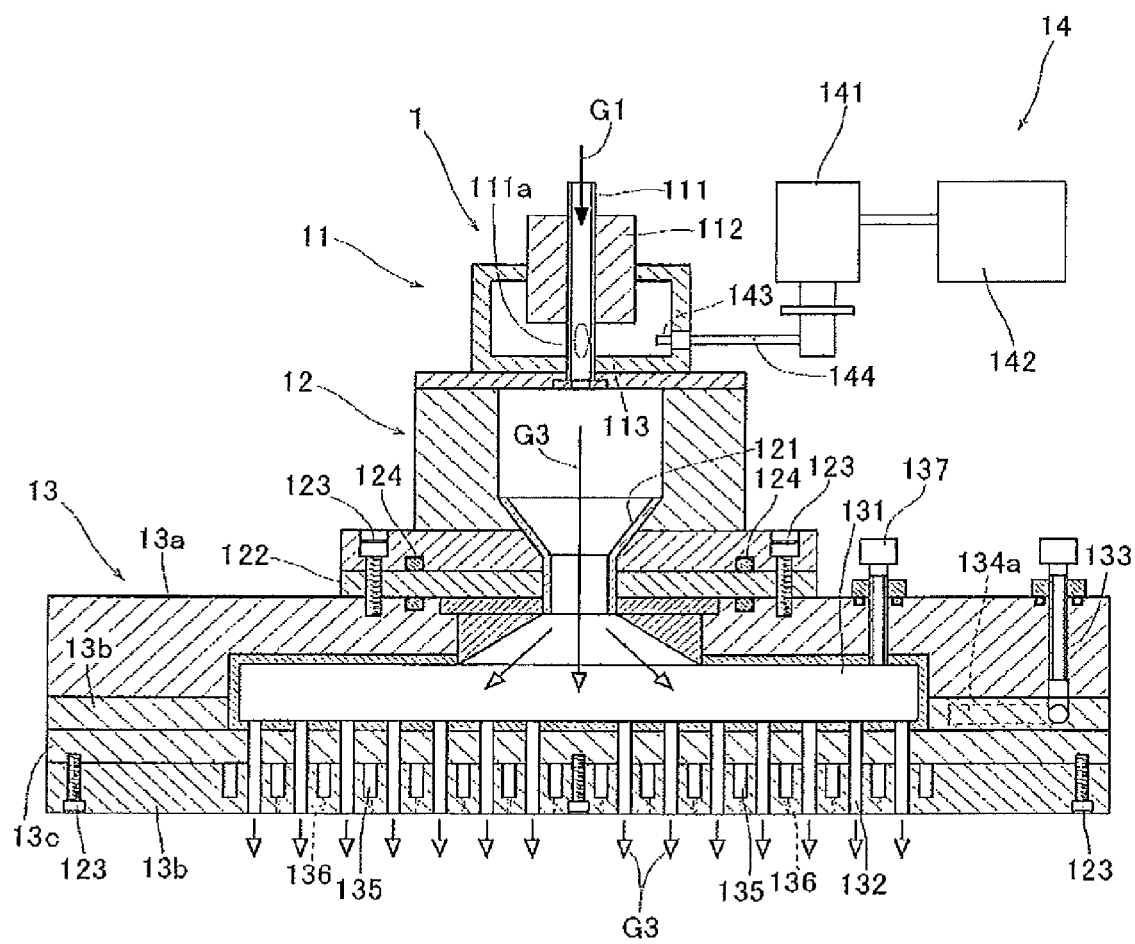
FIG. 8 is a configuration diagram schematically illustrating the operation of the shower head structure 1 in a modification step.
Figure 9:
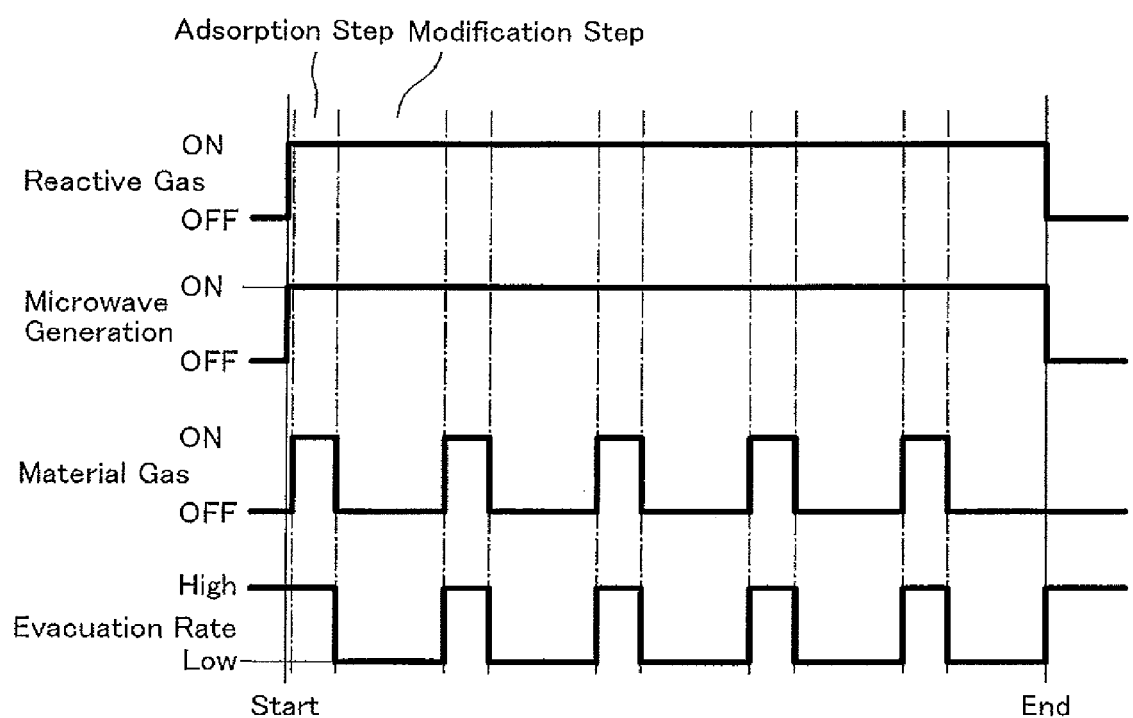
FIG. 9 is a graph showing a process sequence according to an alternative embodiment of the present invention.
Figure 10:
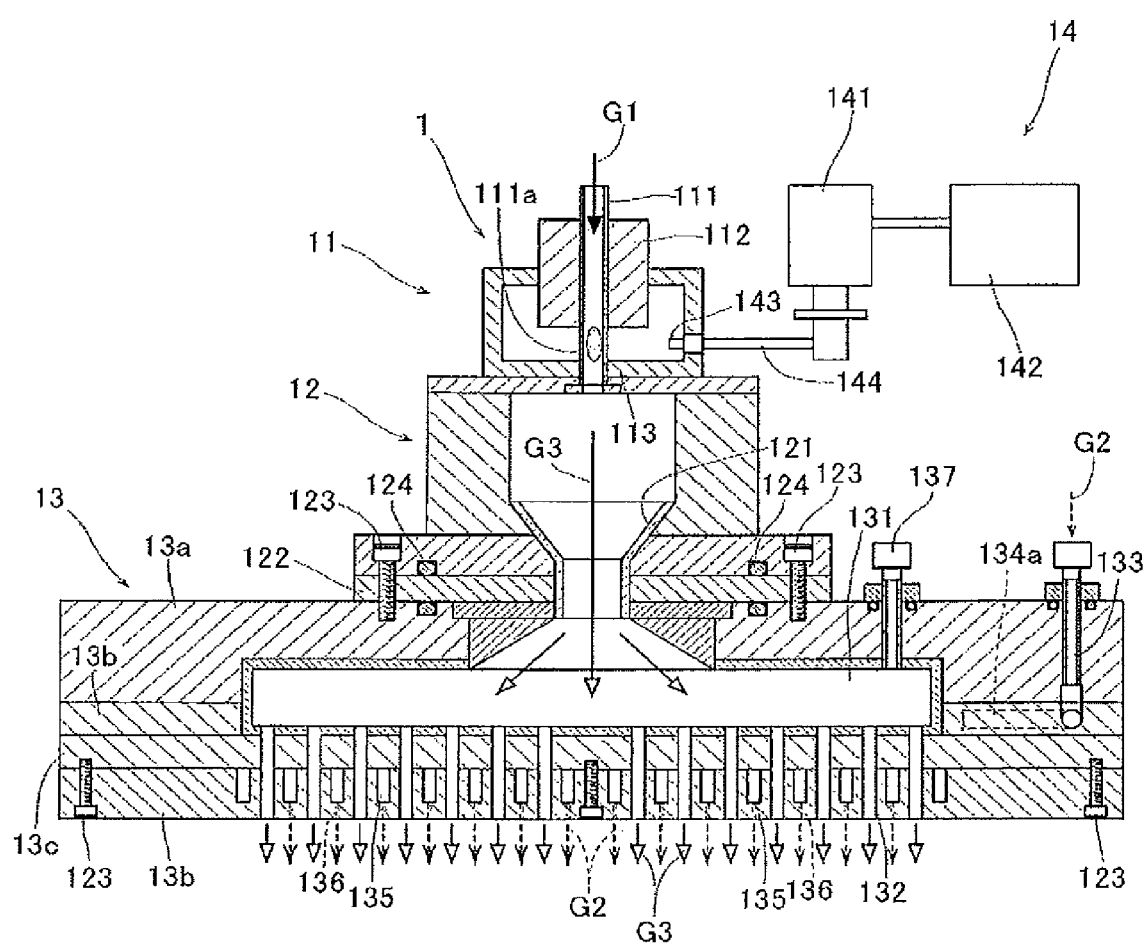
FIG. 10 is a configuration diagram schematically illustrating the operation of the shower head structure 1 in an adsorption step according to the alternative embodiment of the present invention.
Figure 11:
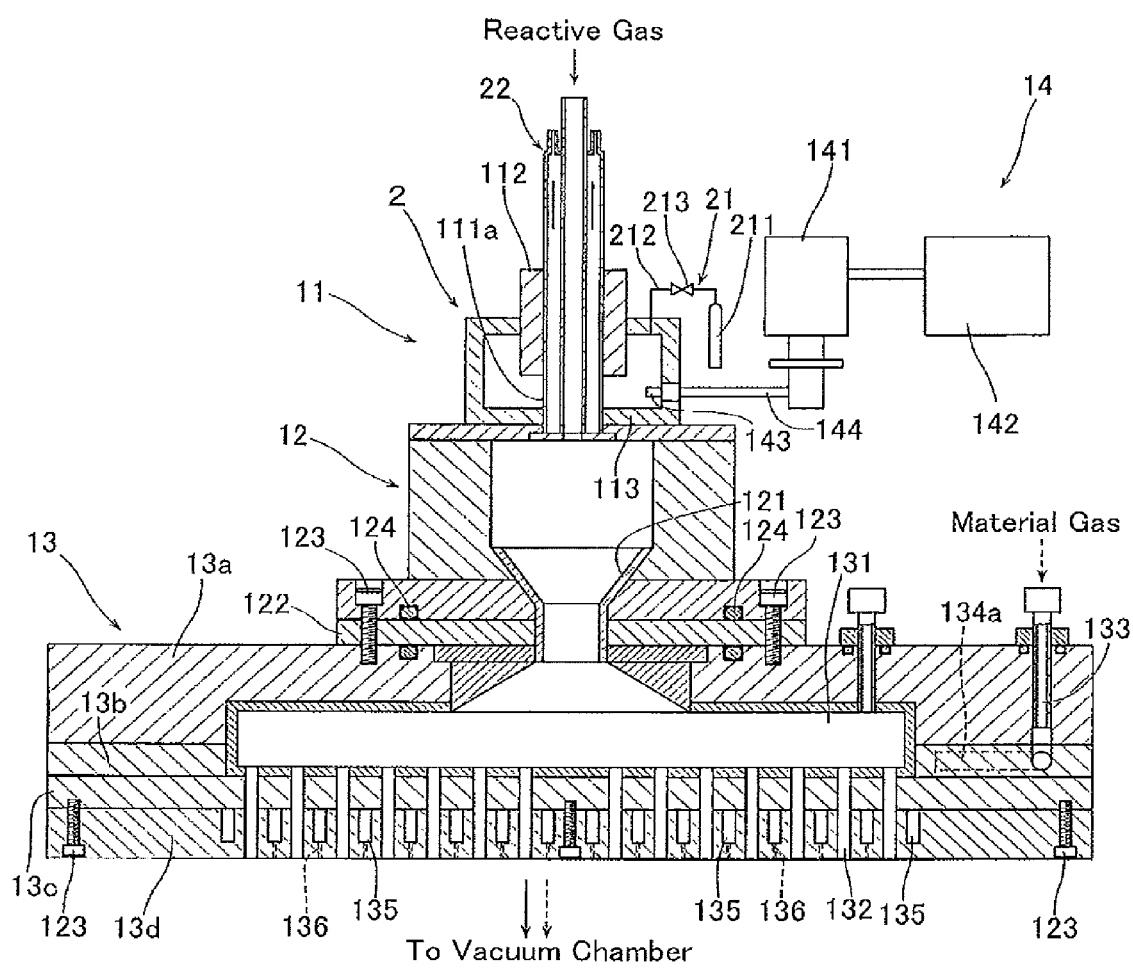
FIG. 11 is a schematic cross-sectional view illustrating the shower head structure 2 of a second coating apparatus.
Figure 12:
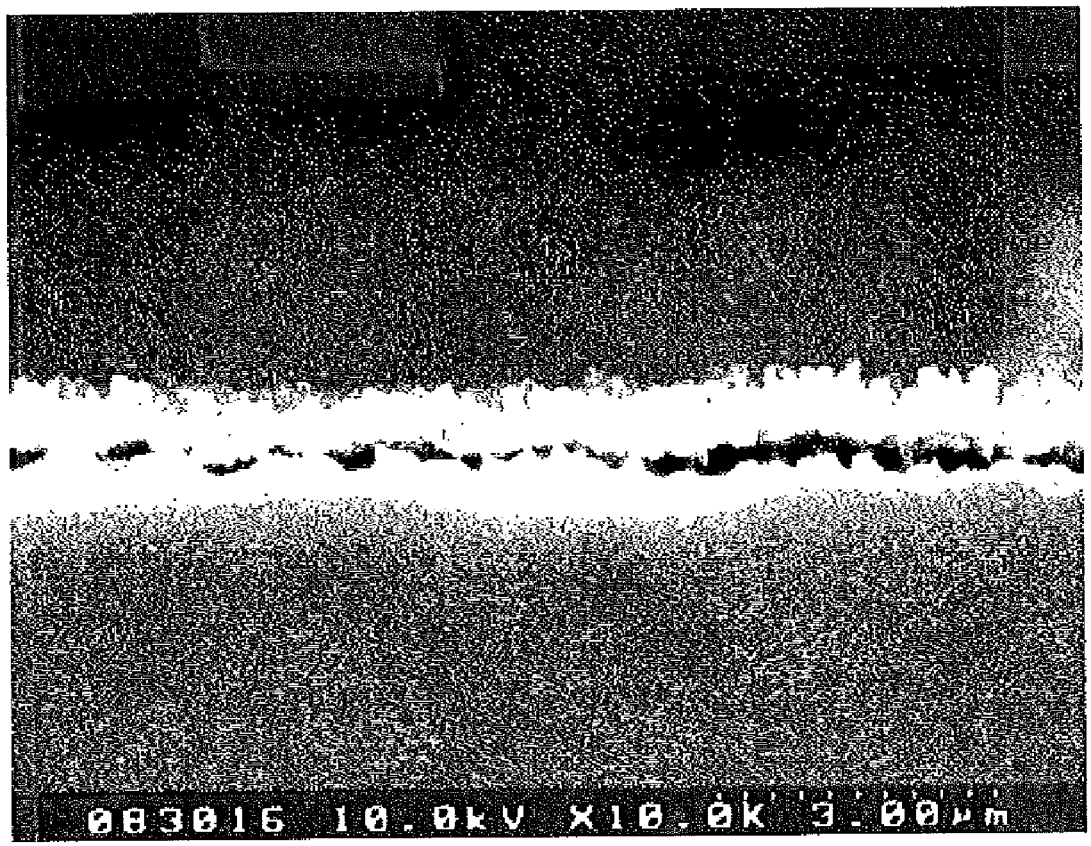
FIG. 12 is an SEM photograph showing the etched inner surface of a nonmetallic pipe.

1 . . . shower head structure
2 . . . shower head structure
11 . . . coaxial resonant cavity
12 . . . gas introduction chamber
13 . . . shower head unit
13a . . . disc-like member
13b . . . ring-like member
13c . . . first shower plate
13d . . . second shower plate
14 . . . microwave supply means
15 . . . material gas introduction apparatus
111 . . . nonmetallic pipe
111a . . . exposed portion
112 . . . upper conductor
113 . . . lower conductor
122 . . . ceramic flange
123, 124 . . . fixing member
131 . . . reactive gas diffusion chamber
132 . . . reactive gas spray hole
133 . . . material gas introduction tube
134 . . . gas path
134a . . . gas path
134b . . . gas path
134c . . . connection hole
134d . . . connection hole
135 . . . material gas diffusion chamber
136 . . . material gas spray hole
137 . . . gas introduction inlet
141 . . . magnetron
142 . . . microwave power supply
143 . . . antenna
144 . . . coaxial cable
151 . . . tank
152 . . . mesh
152a, 152b . . . mesh
153 . . . material
154 . . . mass flow controller
211 . . . gas source
212 . . . gas tube
213 . . . valve
221 . . . sidewall
222 . . . cooling fluid passage 222a . . . upstream portion
222b . . . downstream portion
223 . . . fluid inlet
224 . . . fluid outlet
225 . . . plate
226 . . . opening
227 . . . gas passage
G1 . . . reactive gas
G2 . . . material gas
G3 . . . reactive gas

What is claimed is:

1. A method of forming a barrier film using a coating apparatus provided with plasma generation means including a coaxial resonant cavity and a microwave supply circuit, said coaxial resonant cavity including spaced apart conductors provided on an upper portion and a lower portion of the periphery of a nonmetallic pipe for reactive gas introduction, said coaxial resonant cavity having an inner height equal to an integer multiple of one-half of the exciting wavelength, said plasma generation means being constructed such that a gas injected from one end of said nonmetallic pipe is excited into a plasma state by a microwave when said gas is in a region of said nonmetallic pipe which is not provided with said conductors and such that said gas in said plasma state is discharged from the other end of said nonmetallic pipe, said method comprising:
placing an object to be coated within a vacuum chamber of said coating apparatus, said object to be coated having an insulating film with a hole and a trench formed therein; and
reacting a material gas composed of $Zr(BH_4)_4$ gas with a plasma gas over a surface of said object to be coated, using ALD, to form a barrier film made of a $ZrB_2$ film on said insulating film and on an inner surface of said hole and an inner surface of said trench, said plasma gas being obtained by converting a reactive gas composed of $H_2$ gas into a plasma state by said plasma generation means.

2. The method as claimed in claim 1, further comprising:
repeating an adsorption step and a modification step to form said barrier film made of said $ZrB_2$ film on said insulating film and on said inner surface of said hole and said inner surface of said trench,
wherein said adsorption step supplies said material gas and said reactive gas such that said material gas is adsorbed on said object to be coated having said insulating film with said hole and said trench formed therein; and
wherein said modification step shuts off said supply of said material gas, continuously supplies only said reactive gas, and converts said supplied reactive gas into a plasma state by said plasma generation means such that said reactive gas in said plasma state reacts with and modifies said material gas adsorbed on said object to be coated.

3. The method as claimed in claim 2, wherein when said barrier film is formed, the flow rate of said reactive gas in said adsorption step differs from the flow rate of said reactive gas in said modification step.

4. The method as claimed in claim 1, further comprising:
repeating an adsorption step and a modification step to form said barrier film made of said $ZrB_2$ film on said insulating film and on said inner surface of said hole and said inner surface of said trench,
wherein said adsorption step supplies said material gas and said reactive gas which has been converted into a plasma state by said plasma generation means, such that said material gas is adsorbed on said object to be coated having said insulating film with said hole and said trench formed therein; and
wherein said modification step shuts off only said supply of said material gas and continuously supplies said reactive gas which has been converted into said plasma state by said plasma generation means, such that said reactive gas in said plasma state reacts with and modifies said material gas adsorbed on said object to be coated.

5. The method as claimed in claim 4, wherein when said barrier film is formed, the flow rate of said reactive gas in said adsorption step differs from the flow rate of said reactive gas in said modification step.

6. The method as claimed in claim 1, wherein said barrier film is formed while said object to be coated is heated to a temperature of 50-300° C., said object to be coated being a substrate.

7. The method as claimed in claim 1, wherein said barrier film is formed while a cooling gas is introduced into said coaxial resonant cavity to cool said region of said nonmetallic pipe which is not provided with said conductors.

8. The method as claimed in claim 1, wherein:
said nonmetallic pipe has double sidewalls; and
said barrier film is formed while a cooling fluid is circulated through the space between said sidewalls to cool said nonmetallic pipe.

9. A method of forming a barrier film using a coating apparatus provided with plasma generation means including a coaxial resonant cavity and a microwave supply circuit, said coaxial resonant cavity including spaced apart conductors provided on an upper portion and a lower portion of the periphery of a nonmetallic pipe for reactive gas introduction, said coaxial resonant cavity having an inner height equal to an integer multiple of one-half of the exciting wavelength, said plasma generation means being constructed such that a gas injected from one end of said nonmetallic pipe is excited into a plasma state by a microwave when said gas is in a region of said nonmetallic pipe which is not provided with said conductors and such that said gas in said plasma state is discharged from the other end of said nonmetallic pipe, said method comprising:
placing an object to be coated within a vacuum chamber of said coating apparatus, said object to be coated having an insulating film with a hole and a trench formed therein; and
reacting a material gas composed of $Zr(BH_4)_4$ gas with a plasma gas over a surface of said object to be coated, using ALD, to form a barrier film made of a ZrBN film on said insulating film and on an inner surface of said hole and an inner surface of said trench, said plasma gas being obtained by converting a reactive gas composed of $H_2$ gas mixed with at least one of $N_2$ and $NH_3$ into a plasma state by said plasma generation means.

10. The method as claimed in claim 4, further comprising:
repeating an adsorption step and a modification step to form said barrier film made of said ZrBN film on said insulating film and on said inner surface of said hole and said inner surface of said trench,
wherein said adsorption step supplies said material gas and said reactive gas such that said material is adsorbed on said object to be coated having said insulating film with said hole and said trench formed therein; and
wherein said modification step shuts off said supply of said material gas, continuously supplies only said reactive gas, and converts said supplied reactive gas into a plasma state by said plasma generation means such that said reactive gas in said plasma state reacts with and modifies said material gas adsorbed on said object to be coated.

11. The method as claimed in claim 10, wherein when said barrier film is formed, the flow rate of said reactive gas in said adsorption step differs from the flow rate of said reactive gas in said modification step.

12. The method as claimed in claim 4, further comprising:
repeating an adsorption step and a modification step to form said barrier film made of said ZrBN film on said insulating film and on said inner surface of said hole and said inner surface of said trench,
wherein said adsorption step supplies said material gas and said reactive gas which has been converted into a plasma state by said plasma generation means, such that said material gas is adsorbed on said object to be coated having said insulating film with said hole and said trench formed therein; and
wherein said modification step shuts off only said supply of said material gas and continuously supplies said reactive gas which has been converted into said plasma state by said plasma generation means, such that said reactive gas in said plasma state reacts with and modifies said material gas adsorbed on said object to be coated.

13. The method as claimed in claim 12, wherein when said barrier film is formed, the flow rate of said reactive gas in said adsorption step differs from the flow rate of said reactive gas in said modification step.

14. The method as claimed in claim 9, wherein said barrier film is formed while said object to be coated is heated to a temperature of 50-300° C., said object to be coated being a substrate.

15. The method as claimed in claim 9, wherein said barrier film is formed while a cooling gas is introduced into said coaxial resonant cavity to cool said region of said nonmetallic pipe which is not provided with said conductors.

16. The method as claimed in claim 9, wherein:
said nonmetallic pipe has double sidewalls; and
said barrier film is formed while a cooling fluid is circulated through the space between said sidewalls to cool said nonmetallic pipe.

* * * * *